United States Patent
Liu et al.

(10) Patent No.: US 10,032,813 B2
(45) Date of Patent: Jul. 24, 2018

(54) ACTIVE PIXEL RADIATION DETECTOR ARRAY AND USE THEREOF

(71) Applicant: General Electric Company, Schenectady, NY (US)

(72) Inventors: James Zhengshe Liu, Salt Lake City, UT (US); Habib Vafi, Brookfield, WI (US); Jingyi Liang, Brookfield, WI (US); Nicholas Ryan Konkle, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/365,599

(22) Filed: Nov. 30, 2016

(65) Prior Publication Data

US 2017/0229502 A1    Aug. 10, 2017

Related U.S. Application Data

(60) Provisional application No. 62/292,013, filed on Feb. 5, 2016.

(51) Int. Cl.
*H01L 27/146* (2006.01)
*G01T 1/20* (2006.01)

(52) U.S. Cl.
CPC ...... *H01L 27/14609* (2013.01); *G01T 1/2018* (2013.01); *H01L 27/14676* (2013.01)

(58) Field of Classification Search
CPC ............. G01T 1/2018; H01L 27/14609; H01L 27/14676
See application file for complete search history.

(56) References Cited

U.S. PATENT DOCUMENTS

| 7,016,461 B2 | 3/2006 | Rotondo et al. |
| 7,495,228 B1 * | 2/2009 | Albagli ............ H01L 27/14663 250/370.09 |
| 8,076,647 B2 | 12/2011 | Danielsson et al. |

(Continued)

FOREIGN PATENT DOCUMENTS

EP    2 961 156 A1    12/2015

OTHER PUBLICATIONS

Izadi, M.H. et al., "An a-Si Active Pixel Sensor (APS) Array for Medical X-ray Imaging," IEEE Transactions on Electron Devices, vol. 57, No. 11, pp. 3020-3026 (Nov. 2010).

(Continued)

*Primary Examiner* — David Porta
*Assistant Examiner* — Faye Boosalis

(57) ABSTRACT

Fabrication and use of an X-ray detector scan interface having separate enable and reset lines for each line (e.g., row) of pixels is described. In certain implementations, the respective enable and reset lines are connected such that activation of an enable line for a given line of pixels is concurrent with activation of a reset line for a different (e.g., preceding) row of pixels. In this manner, readout of one row of pixels is performed in conjunction with resetting the row of pixels readout in the preceding operation. In another technical implementation, a non-rectangular detector is divided into quadrants, with alternating quadrants configured for scan module or data module operations such that no quadrant has overlapping scan and data interconnections at the connection finger regions.

19 Claims, 15 Drawing Sheets

(56) References Cited

U.S. PATENT DOCUMENTS

| | | |
|---|---|---|
| 8,193,501 B2 | 6/2012 | Rutten et al. |
| 8,903,043 B2 | 12/2014 | Durst et al. |
| 8,942,346 B2 | 1/2015 | Nicholson et al. |
| 2002/0090184 A1 | 7/2002 | Sayag |
| 2003/0058989 A1 | 3/2003 | Rotondo et al. |
| 2004/0120457 A1 | 6/2004 | Karellas et al. |
| 2006/0126780 A1 | 6/2006 | Rotondo et al. |
| 2009/0321643 A1 | 12/2009 | Rutten et al. |
| 2010/0096558 A1 | 4/2010 | Danielsson et al. |
| 2012/0181437 A1 | 7/2012 | Nelson et al. |
| 2013/0037857 A1 | 2/2013 | Von Kanel et al. |
| 2013/0103339 A1 | 4/2013 | Durst et al. |
| 2014/0177795 A1 | 6/2014 | Spahn |
| 2015/0046112 A1 | 2/2015 | Durst et al. |
| 2015/0160352 A1* | 6/2015 | Tredwell ................. G01T 1/175 378/98.8 |
| 2016/0070004 A1 | 3/2016 | Liu |

OTHER PUBLICATIONS

Netherlands Search Report and Written Opinion issued in connection with corresponding NL Application No. 2018083 dated Jul. 5, 2017.

\* cited by examiner

ACTIVE PIXEL RADIATION DETECTOR ARRAY AND USE THEREOF

CROSS-REFERENCE TO RELATED APPLICATION

This application claims priority to and the benefit of U.S. Provisional Application No. 62/292,013, entitled "ACTIVE PIXEL RADIATION DETECTOR ARRAY AND USE THEREOF", filed Feb. 5, 2016, which is herein incorporated by reference in its entirety.

BACKGROUND

This application relates generally to systems and methods for obtaining and displaying an X-ray image. In particular, this application relates to systems and methods for generating an X-ray image using a digital flat panel detector constructed using silicon wafers, such as crystalline silicon wafers.

Digital X-ray imaging systems are used to generate digital data in a non-invasive manner and to reconstruct such digital data into useful radiographic images. In current digital X-ray imaging systems, radiation from a source is directed toward a subject or object, typically a patient in a medical diagnostic application, a package or baggage in a security screening application, or a fabricated component in an industrial quality control or inspection application. A portion of the radiation passes through the subject or object and impacts a detector. The scintillator of the detector converts the higher-energy X-ray radiation to lower-energy light photons that are sensed using photo-sensitive components (e.g., photodiodes or other suitable photodetectors) present on a light imager panel. The light imager panel is typically divided into a matrix of discrete picture elements or pixels, and encodes output signals based upon the quantity or intensity of the radiation impacting the scintillator above each pixel region. The signals may then be processed to generate an image that may be displayed for review.

The light imager panel may be based on or formed from a silicon semiconductor substrate. Such a silicon substrate may be provided as crystalline silicon (c-Si), which consists of an ordered silicon matrix (e.g., a well ordered crystal lattice), or amorphous silicon (a-Si), which does not have an ordered matrix (e.g., a random crystal lattice). The random crystal lattice of a-Si allows an electron mobility of <1 $cm^2/(v \cdot s)$ while the ordered crystal lattice of c-Si allows an electron mobility of approximately 1,400 $cm^2/(v \cdot s)$. Because of the higher electron mobility associated with c-Si, the size of features that can be formed using c-Si can be much smaller than those formed from the a-Si, enabling multiple-gate active pixel sensor (APS) designs for a given pixel size. This is in contrast to conventional a-Si designs, in which the number of pixel features for the same pixel size may be limited (e.g., to two), such as to a photodiode and transistor gate. Indeed, in a c-Si APS design, a charge amplifier and/or other relevant electrical features (e.g., additional transistor and/or capacitors) may be provided in each pixel in addition to the basic photodiode and main TFT. Further, at the level of the light imager panel itself, other features, such as analog to digital conversion circuitry (A/D) and readout scanning circuitry, may be provided, as opposed to using off-panel modules. However, even in a c-Si context, there may be other considerations that might favor providing certain such functionality off of the light imager panel.

Light imager panels based on c-Si technology, such as those employing complementary metal-oxide-semiconductors (CMOS) formed from c-Si, may be costly to fabricate for a variety of factors. For example, depending on the size and shape of the light imager panel to be fabricated, multiple c-Si wafers may be needed to fabricate pieces of the panel, which may be tiled to form the overall panel. Likewise, the fabrication time (e.g., the number of masks applied and/or processing steps performed) is proportional to fabrication costs. Similarly, the yield of the fabricated wafers and/or of the cutting and tiling processes may limit the cost improvements that are possible. The present approaches address one or more of these factors.

BRIEF DESCRIPTION

In one embodiment, a flat panel X-ray detector is provided. In accordance with this embodiment, the flat panel X-ray detector includes a scintillator layer that converts X-ray photons into lower energy light photons and a light imager layer configured to convert the light photons into electrons. The light imager layer has an array of active pixels, each active pixel comprising a reset gate and a readout select gate. A first controlling terminal of a respective readout select gate of at least one active pixel is connected to a second controlling terminal of the reset gate of a different active pixel. The flat panel X-ray detector also includes a readout device that converts the electrons into digitized pixel values, and a communication unit that transfers the pixel values to an imaging system that is connected to the detector.

In a further embodiment, a method is provided for reading out a flat panel detector. In accordance with this method, outputs of a scan circuitry are sequentially activated. Each output of the scan module, when activated, causes a current respective row of pixels to be selected for readout and concurrently causes a preceding row of pixels to be reset. Pixel values are acquired as each respective row of pixels is selected for readout.

In another embodiment, a flat panel X-ray detector is provided. In accordance with this embodiment, the flat panel X-ray detector includes a scintillator layer that converts X-ray photons into lower energy light photons and a light imager layer configured to convert the light photons into electrons. The light imager layer is partitioned into: two scanning quadrants comprising scanning circuitry or contacting traces connecting to off-panel scanning circuitry and two readout quadrants comprising readout circuitry or contacting traces connecting to off-panel readout circuitry. The scanning quadrants and readout quadrants are alternated with one another. The flat panel X-ray detector also includes a readout device that converts the electrons into digitized pixel values, and a communication unit that transfers the pixel values to an imaging system that is connected to the detector.

In an additional embodiment, a method for forming connections on or to a radiation detector is provided. In accordance with this method: in a first quadrant of a light image panel of the radiation detector, forming only scan line interconnections in a first direction; in a second quadrant of the light imager panel, forming only data line interconnections in a second direction different from the first direction; in a third quadrant of the light imager panel, forming only scan line interconnections in the first direction; and in a fourth quadrant of the light imager panel, forming only data line interconnections in the second direction. Within a plane defined by the radiation detector, the second quadrant is between the first quadrant and the third quadrant and the fourth quadrant is between the third quadrant and the first quadrant and opposite the second quadrant.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

Figure 1:
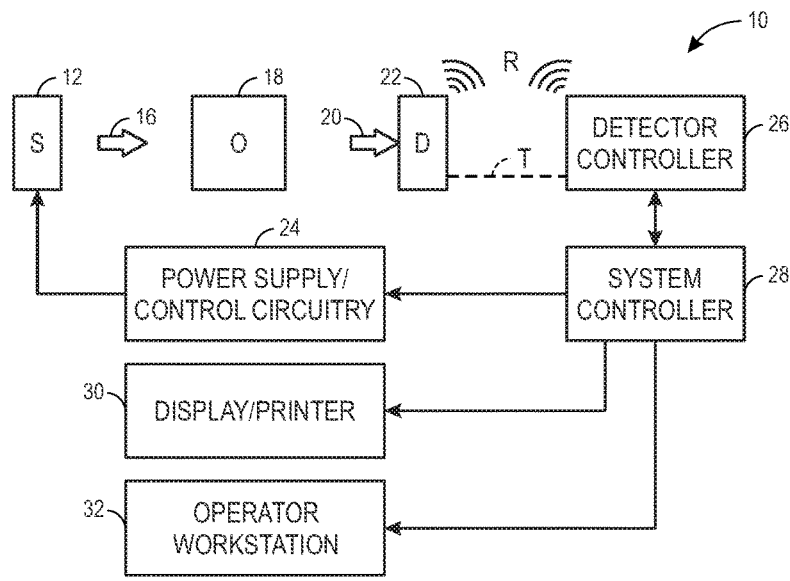
FIG. 1 depicts a block-diagram of an embodiment of a digital X-ray imaging system, in accordance with aspects of the present disclosure.

In the drawings, the thickness and size of components may be exaggerated or otherwise modified for clarity. Further, for clarity, the drawings may show simplified or partial views, and the dimensions of elements in the drawings may be exaggerated or otherwise not in proportion.

DETAILED DESCRIPTION

One or more specific implementations will be described below. In an effort to provide a concise description of these implementations, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements.

While the following discussion is generally provided in the context of medical imaging, it should be appreciated that the present techniques are not limited to such medical contexts. Indeed, any examples and explanations provided in such a medical context is only to facilitate explanation by providing instances of real-world implementations and applications. However, the present approaches may also be utilized in other contexts, such as the non-destructive inspection of manufactured parts or goods (i.e., quality control or quality review applications), and/or the non-invasive inspection of packages, boxes, luggage, and so forth (i.e., security or screening applications).

Light imager panels based on crystalline silicon (c-Si) technology (such as those employing complementary metal-oxide-semiconductors (CMOS) formed from c-Si) may outperform comparable amorphous silicon (a-Si) imager panels in various ways when used in an X-ray detector. However, c-Si light imager panels are typically associated with higher cost and smaller panel size due to limitations in the practical size of silicon wafers used to fabricate c-Si devices. Such cost and wafer efficiency issues may limit the practicality of using c-Si light imager panels in conventional X-ray detectors.

As discussed herein, approaches are discussed for overcoming certain of the limitations typically associated with c-Si fabrication techniques to form viable light imager panels of suitable size for use in an X-ray detector. By way of example, approaches for interconnecting and reading out a light imager panel having an array of active pixels are described. In practice, such active pixels include amplification circuitry within each pixel and may also employ separate readout select (i.e., "scan") and reset lines for each row or column of pixels and running counter (e.g., perpendicular) to the data lines of the pixel array. Such an arrangement separates the line selection and reset operations for the pixels, allowing multiple readout operations to be performed without a reset of the pixels. In contrast, in conventional passive pixel arrangements, readout selection and reset functionality is associated with the same action, i.e., a photodiode is readout when enabled by charging the photodiode, thus resetting the photodiode and providing a measure of the charge depletion of the photodiode (i.e., reading out the pixel). Thus, a single scan line is used to simultaneously readout and reset a given pixel.

The use of separate lines for readout (i.e., scan) and reset in the active pixel arrangement, however, can further complicate the interconnection arrangement needed to control such actions, as contact regions are needed to connect to each line. In particular, for pixel arrangements having good spatial resolutions (e.g., 0.1×0.1 mm or less) the available space is already limited and, depending on the detector configuration, interconnection of the data lines may also need to be accounted for. While it may be feasible to fan or spread out the contact regions to allow for the increased number of interconnections, such approaches may require space that is not available and/or may lengthen the distance that analog signals are propagated, leading to increased noise relative to signal. In addition, controlling the scan terminal and the reset terminal separately may also add cost to the off-panel modules.

The present approaches address various aspects of these problems. For example, in certain implementations, a staggered readout select and reset approach may be employed by which a given signal causes the simultaneous readout of a given row or column of pixels and the reset of the row or column of pixels read out in the preceding readout operation or clock cycle. In other approaches, a given panel may be split into quadrants (or other suitable piecemeal arrangements) with staggered, i.e., alternating, data and scan line interconnection, thus providing additional interconnect spacing along each side.

With the preceding in mind, and turning now to the drawings, FIG. 1 illustrates diagrammatically an imaging system 10 for acquiring and processing image data using a detector fabricated and/or operated as discussed herein. In the illustrated embodiment, system 10 is a digital X-ray system designed both to acquire original image data and to process the image data for display. The imaging system 10 may be a stationary or mobile X-ray system. In the embodiment illustrated in FIG. 1, imaging system 10 includes a source of X-ray radiation 12 that emits a stream of radiation 16 into a region in which an object or subject 18 is positioned. The X-ray radiation source 12 is controlled by a power supply/control circuit 24 which furnishes both power and control signals for examination sequences. A portion of the radiation 20 passes through or around the subject and impacts a digital X-ray detector, represented generally at reference numeral 22. The detector 22 may be portable or permanently mounted to the system 10. In certain embodiments, the detector 22 may convert the incident X-ray photons to lower energy photons which are detected. Electrical signals are generated in response to the detected photons and these signals are processed to reconstruct an image of the features within the object or subject.

As discussed herein, the detector array 22 may include one or more CMOS light imager panels, each separately defining an array of detector elements (e.g., active pixels). Each detector element produces an electrical signal that represents the intensity of the X-ray beam incident at the position of the detector element when the beam strikes the detector 22. In the depicted example, the detector 22 includes or communicates with a detector controller 26 (e.g., control circuitry) which commands acquisition of the signals generated in the detector 22. In the presently illustrated embodiment, the detector 22 may communicate with the detector controller 26 via any suitable wireless communication standard (R), although the use of digital X-ray detectors 22 that communicate with the detector controller 26 through a cable (T) or some other mechanical connection are also envisaged. Alternatively, operational aspects of the detector controller 26 may be implemented on, or otherwise provided of, the detector 22 itself in some implementations. Detector controller 26 may also execute various signal processing and filtration functions, such as for initial adjustment of dynamic ranges, interleaving of digital image data, and so forth.

Both power supply/control circuit 24 and detector controller 26 are responsive to signals from a system controller 28. In general, system controller 28 commands operation of the imaging system to execute examination protocols and to process acquired image data. In the present context, system controller 28 may also include signal processing circuitry and one or more data storage structures, such as optical memory devices, magnetic memory devices, or solid-state memory devices, for storing programs and routines executed by a processor of the system 10 to carry out various functionalities, as well as for storing configuration parameters and image data. In one embodiment, a programmed computer system may be provided with hardware, circuitry, firmware, and/or software for performing the functions attributed to one or more of the power supply/control circuit 24, the detector controller 26, and/or the system controller 28.

In the embodiment illustrated in FIG. 1, system controller 28 is linked to at least one output device, such as a display or printer as indicated at reference numeral 30. The output device may include standard or special purpose monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, cloud-based network, and so forth.

The X-ray system 10 as shown in FIG. 1 may also include a variety of alternative embodiments generally configured to meet the particular needs of certain applications. For example, the X-ray system 10 may be either fixed, a mobile system, or a mobile C-arm system where the X-ray detector is either permanently mounted inside one end of the C-arm or removable from the system. Further, the X-ray system 10 may be a table and/or wall stand system in a fixed X-ray room where the X-ray detector 22 is either permanently mounted together with the system or portable. Alternatively, the X-ray system 10 may be a mobile X-ray system with a portable X-ray detector. Such a portable X-ray detector may be further constructed with a detachable tether or cable used to connect the detector readout electronics to the data acquisition system of the scanner. When not in use, a portable X-ray detector may be detached from the scan station for storage or transfer. In practice, the imaging system 10 may be any suitable X-ray based imaging system, including, but not limited to, conventional radiography systems, CT imaging systems, tomosynthesis systems, C-arm systems, fluoroscopy systems, mammography systems, dual- or multiple-energy systems, navigational or interventional imaging systems, and so forth.

Figure 2:
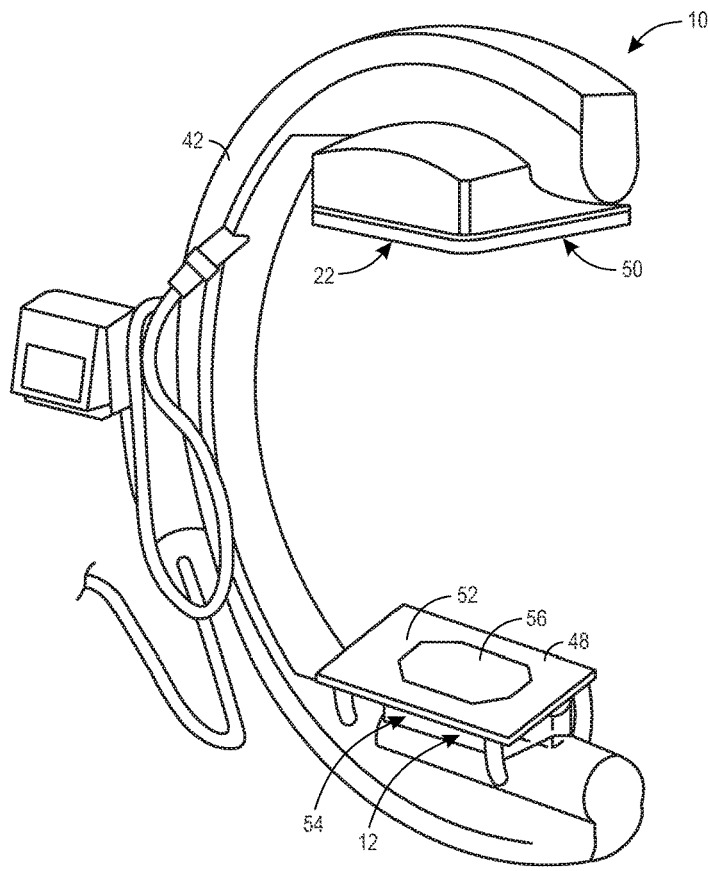
FIG. 2 depicts an implementation of an X-ray imaging system, in accordance with aspects of the present disclosure.

While the preceding schematically describes components of an X-ray based imaging system 10, including a detector and detector control and readout circuitry as discussed herein, FIG. 2 depicts an example of how such an imaging system 10 may be provided in a real-world context. As noted above, the X-ray system 10 may be implemented as a mobile X-ray device (e.g., an X-ray device comprising a C-arm, a mini C-arm, an O-arm, a non-circular arm, and so forth), and a fixed X-ray device. By way of illustration, FIG. 2 shows an X-ray imaging system 10 that comprises a C-arm X-ray device 42 configured to rotate a detector panel 22 and X-ray source 12 about a volume to be imaged. In the depicted example, the X-ray system 10 also includes a collimator 48. Any suitable X-ray source 12 can be used, including a standard X-ray source, a rotating anode X-ray source, a stationary or fixed anode X-ray source, a solid state X-ray emission source, or a fluoroscopic X-ray source 54 (as shown in FIG. 2). Any suitable X-ray detector 22 can be used, including a digital detector as discussed in greater detail below.

FIG. 2 shows an implementation in which the collimator 48 comprises an X-ray attenuating material 52 that defines an aperture 56 through which X-ray may pass, and which in turn prevents or limits X-ray emission beyond the bound of the defined aperture, thus shaping and limiting the defined beam. The collimator 48 can comprise any suitable X-ray attenuating material 52 that allows it to collimate an X-ray beam in this manner. Some examples of suitable X-ray attenuating materials include tungsten, lead, gold, copper, tungsten-impregnated substrates (e.g., glass or a polymer impregnated with tungsten), coated substrates (e.g., glass or a polymer coated with tungsten, lead, gold, etc.), steel, aluminum, bronze, brass, rare earth metals, or combinations thereof.

Figure 3:
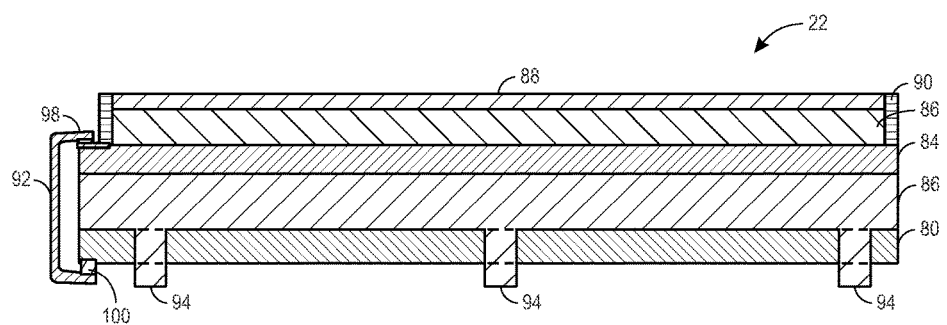
FIG. 3 shows a schematic side view illustrating components of a flat panel detector, in accordance with aspects of the present disclosure.

With respect to the detector component 22 of an imaging system 10, FIG. 3 depicts a cross-section side-view illustrating components that may be present in such a detector 22. In the example depicted in FIG. 3, the flat panel detector (or detector assembly) 22 contains a circuit board 80, a supporting substrate 82, a light imager panel 84, scintillator 86, scintillator cover 88, sealant 90, and connector 92. In the depicted example, the substrate 82 may primarily provide support to the remainder of components in the detector 10. Accordingly, the substrate 82 can be made of any material and/or structure that provides this support. In some configurations, the substrate 82 can be made from metal, metal alloy, plastic, a composite material, carbon fiber, or a combination of these materials.

In FIG. 3, the detector controlling electronics are structured underneath the supporting substrate 82 and connected to the light imager 84 through the connector 92 in order to maintain a minimal x-y dimension. The supporting substrate 82 is connected to the detector cover with the connection poles 94 through suspensive components. The components of the detector 10 illustrated in FIG. 3 may represent only some of the components present in such detection systems. For example, detectors 10 may include other electronics, batteries, wireless transceivers, communication and power supply cables, an outer cover or sleeve, suspensive components, and so forth.

In the depicted detector implementation of FIG. 3, the detector 22 (e.g., a CMOS based detector) includes a scintillator layer (e.g., scintillator 86) that is disposed on a light imager panel 84 (e.g., CMOS light imager). The scintillator 86 may be fabricated from any scintillator compositions such as cesium iodide (CsI) or lutetium oxide ($Lu_2O_3$). To protect the scintillator 86 from moisture and to provide structural support, a scintillator cover (or cover) 88 may be placed over the surface of the scintillator 86, as shown in FIG. 3. The cover 88 may be fabricated with metal, metal alloy, plastic, a composite material, or a combination of the above material. In some embodiments, the cover 88 may be composed of low X-ray attenuation, lightweight, durable composite material such as a carbon fiber. In some embodiments, the detector 10 may include a moisture blocking layer or sealant to block moisture from entering into the scintillator material 86. Thus, as illustrated in FIG. 3, the detector 10 includes a sealant 90 that can be disposed around the side surface of the cover 88 as well as the outer edges of the scintillator 86.

In some configurations, the light imager 84 includes a pixelated photodetection layer, as discussed in greater detail below. Some conventional detached scintillator plates (e.g., in CMOS based detectors) are coated by a protective film that exhibits poor light reflection and transparency properties which results in sub-optimal performance of the photodetection capabilities of the X-ray detector. To alleviate this deficiency, the scintillator 86 in detector 10 can be directly disposed upon the photodetection layer of the light imager 84. Thus, in these configurations, the scintillator 86 can directly contact the photodetection layer.

As discussed herein, the scintillator 86 and the photodetection layer of the light imager 84 function in combination to convert X-ray photons to electrical signals for acquiring and processing image data. Generally, X-ray photons are emitted from a radiation source (such as an X-ray source 12), traverse the area in which an object 18 or subject is positioned, and then collide with the scintillator 86. The scintillator 86 converts the X-ray photons to lower energy optical photons and is designed to emit light proportional to the energy and the amount of X-rays absorbed. As such, light emissions will be higher in those spatial regions of the scintillator 86 where more X-rays were received. Since the composition of the object or subject will attenuate the X-rays projected by the radiation source to varying degrees, the energy level and the amount of the X-ray photons colliding with the scintillator 86 will not be uniform across the scintillator 86. The non-uniform collision results in the variation of light emission that will be used to generate contrast in the reconstructed image.

After the X-ray photons are converted to optical photons, the resulting optical photons emitted by the scintillator 86 are detected by the photodetection layer of the light imager 84. The photodetection layer may contain an array of photosensitive elements or detector elements (e.g., pixels) that store an electrical charge in proportion to the quantity of incident light absorbed by the respective detector elements. Generally, each detector element has at least a light sensitive region and an electronically-controlled region (e.g., a thin-film-transistor (TFT)) for the storage and output of electrical charge from that detector element. The light sensitive region may be composed of a photodiode, which absorbs light and subsequently creates electronic charges stored in the photodiode or a storage capacitor. After exposure, the electrical charge in each detector element is read out via logic-controlled electronics and processed by the imaging system.

The detector 10 also contains an electrical connection between the light imager 84 and the circuit board 80. In the embodiments illustrated in FIG. 3, this electrical connection comprises flex connector 92. The flex connector 92 is used to connect the circuit board 80 and the light imager 84 (both of which are substantially rigid) with room for the movement of one or both. The light imager 84 in FIG. 3 may shift due to mechanical force such as vibration, yet the flex connector 92 maintains the electrical connection despite this movement. The flex connector 92 can be connected to the light imager 84 and the circuit board 80 using any connection, including a thermosonic bond 98 to the light imager 84 and Hirose-type connector 100 to the circuit board 80.

Figure 4:
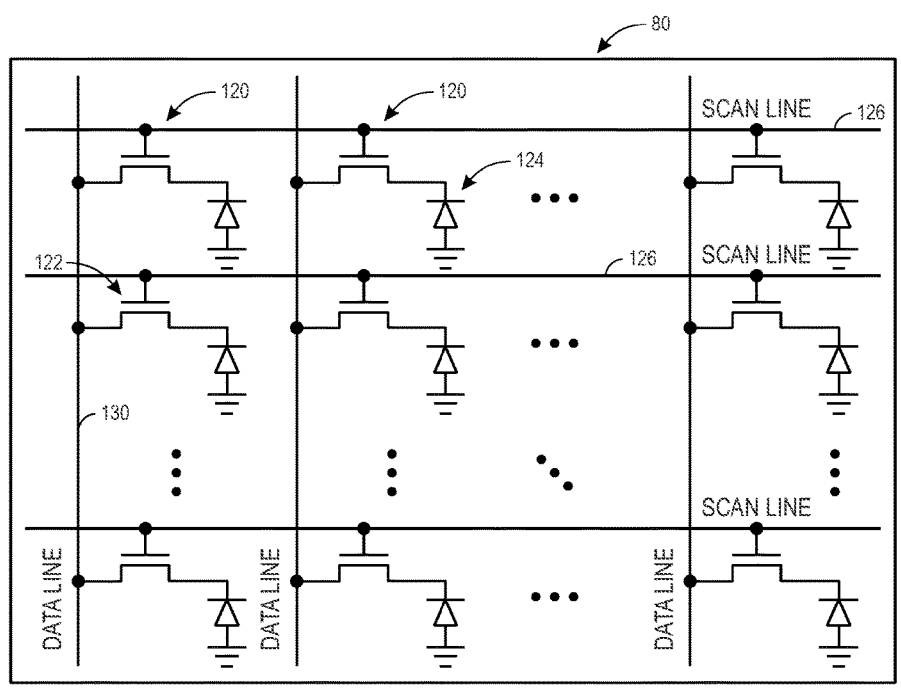
FIG. 4 depicts a prior art passive pixel arrangement of a light imager panel for use in an X-ray detector.

With respect to the fabrication and operation of the light imager 84, certain aspects of the present approach provide for the fabrication and use of light imager panels incorporating active pixel sensor (APS) technology. Examples of such APS technology may include c-Si based light imager panels featuring separate readout select and reset lines running in the scan direction. To further illustrate these concepts, an example of a conventional passive pixel arrangement is shown in FIG. 4. In this example, as will be appreciated, the pixels are constituents of an overall pixel array provided on a light imager panel that may be incorporated as part of a digital detector. In particular, the light imager panel may be provided as part of a digital detector so as to allow measurement of light emitted by a scintillator in spatially discrete units (i.e., pixels) so as to effectively allow the detector to measure X-ray incidence at each pixel at sequential time or scan intervals.

In the depicted example, a plurality of passive pixels 120 are provided, each defined by a single thin film transistor (TFT) 122 and a single photodiode 124. The gate of each respective TFT 122 is connected to a respective scan line 126 where, in the depicted example, a single scan line 126 is provided for each row of pixels 120. Similarly, a single data line 130 is provided for each column of pixels. As will be appreciated, the terms "row" and "column" as used herein denote horizontal and vertical directionality within an array that may be alternated or transposed without changing the underlying operational characteristics or functions of the described operations and circuitry. In a more general sense, a given scan line or data line may be understood to interconnect to a line of pixels, the directionality of which may be denoted by the row or column descriptor.

In the depicted passive pixel arrangement, as noted above, each pixel 120 is connected to drive and readout circuitry via a single scan line 126 and a single data line 130. As noted herein, in such a passive pixel arrangement, the respective scan line connected to each pixel provides both readout selection and reset functionality. As a consequence of the limited data and scan line requirements, interconnection of these lines to corresponding drive and readout circuitry may be straightforward in terms of spacing and layout.

Figure 5:
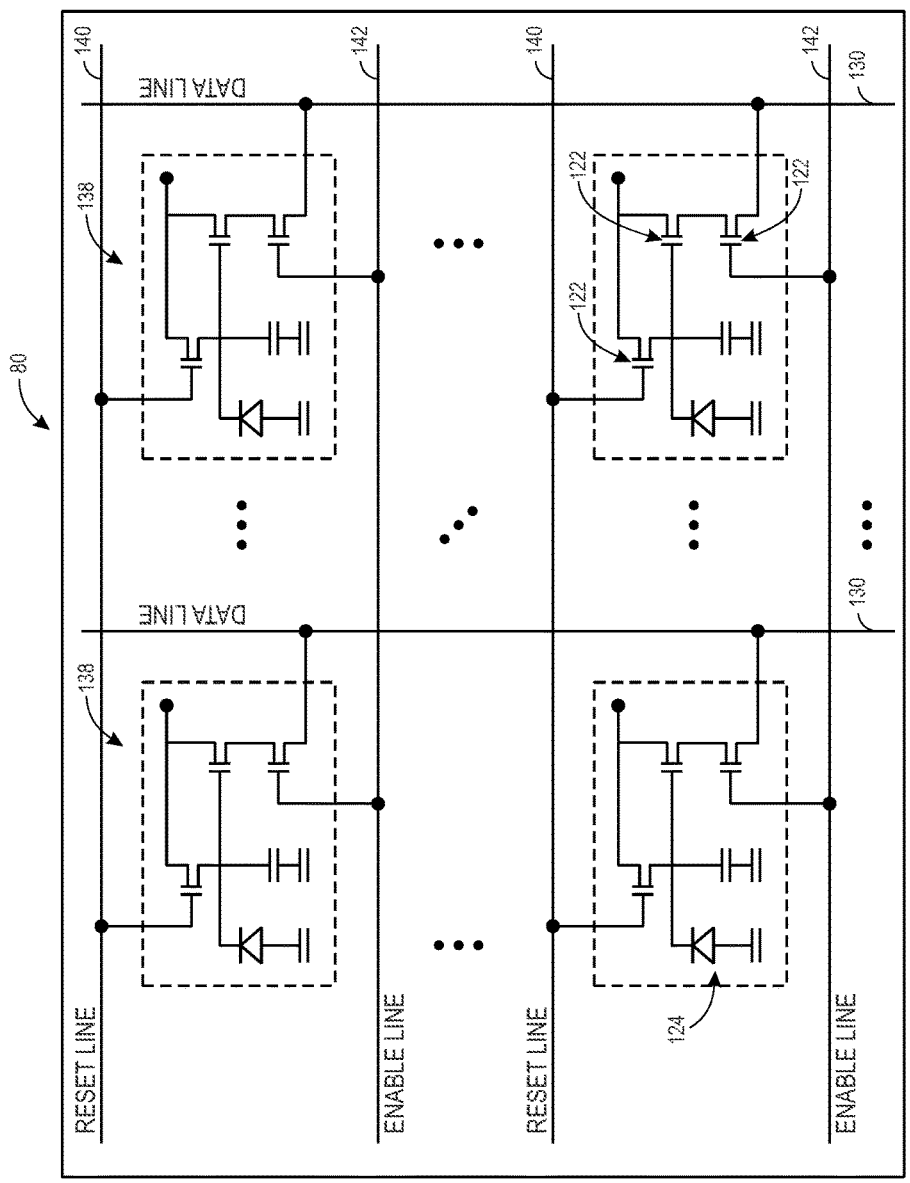
FIG. 5 depicts an active pixel arrangement, in accordance with aspects of the present disclosure.

In contrast, and turning to FIG. 5, a light imager panel 80 having an array of active pixels 138 may be more problematic in terms of providing interconnections to the respective readout selection and reset lines. By way of example, the active pixels 138 of FIG. 5 are each respectively connected to a single data line 130 as well as to two separate lines performing the functions of the scan line 126 of FIG. 4, an enable (i.e., readout select) line 142 (used to set on/off for a respective line of pixels 138) and a reset line 140 (used to reset the respective line of pixels 138). It should be noted that in practice, the readout select lines 142 may also be referred to as "scan" lines, however to avoid confusion with the scan lines 126 described with respect to FIG. 4, they are referred to herein as enable or readout select lines.

In particular, in the depicted example, each column of pixels 138 communicates with a respective data line 130 while each row of pixels 138 is interconnected to both a reset line 140 (connected to a reset gate), which may be employed to reset the charge state of the respective photodiodes 124 of the interconnected pixels, and an enable line 142 (connected to a readout select gate), which may be employed to set an on/off state of the interconnected pixels 138. In this arrangement, a pixel 138 may be selected for readout multiple times, if needed, before being reset as the readout select and reset operations may be performed independent of one another. However, as may be appreciated, when the pixels 138 are high resolution (e.g., 0.1×0.1 mm or smaller), the number of lines running in the scan direction may preclude easy interconnection at the edge of the array. That is, there may be insufficient space for the respective contacting fingers needed to form discrete interconnections to both the reset lines 140 and enable lines 142 in the scan direction.

Figure 6:
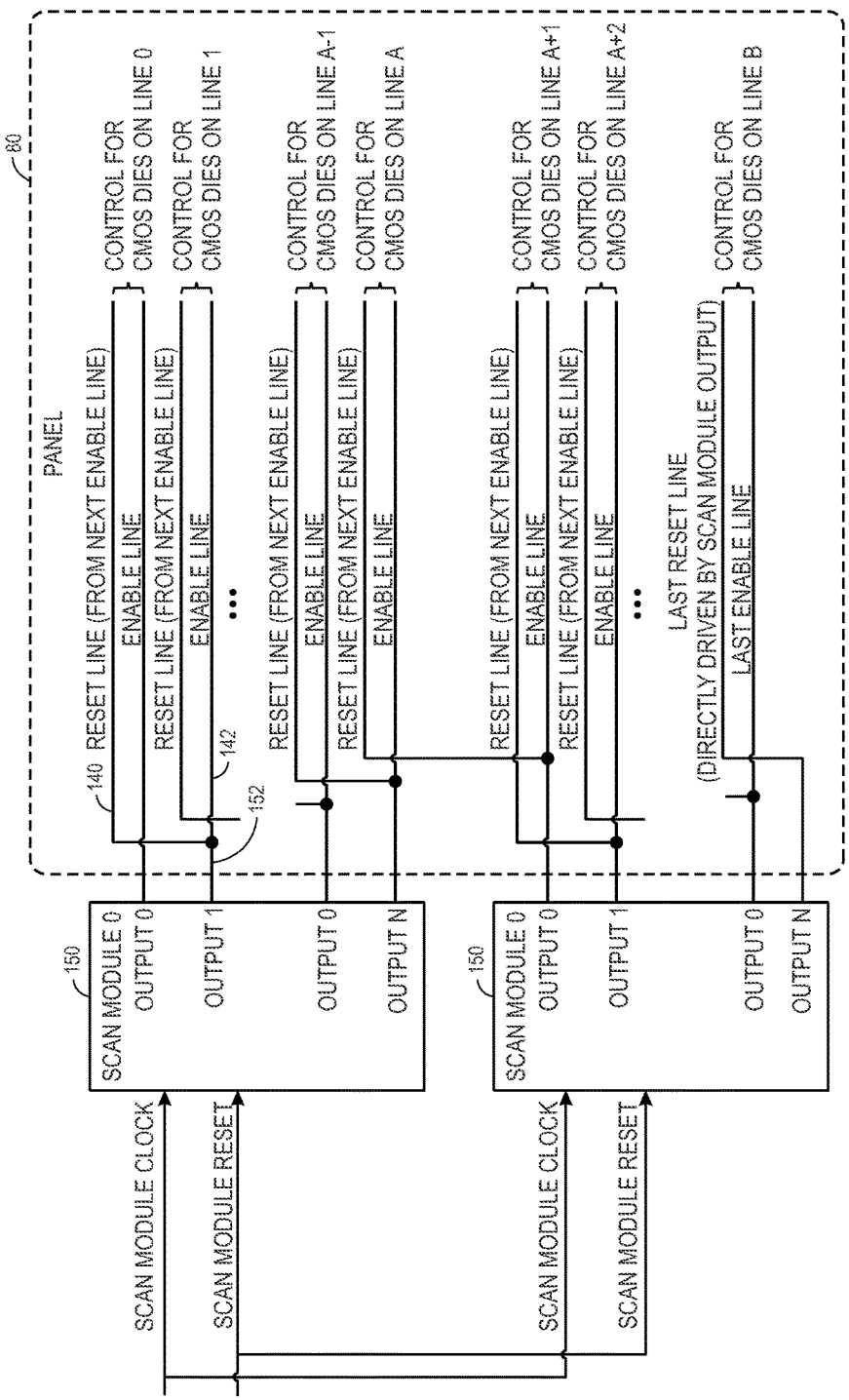
FIG. 6 depicts a schematic of scan module outputs configured to read a current line of pixels while resetting a preceding line of pixels, in accordance with aspects of the present disclosure.

To address this issue, in one implementation the respective enable and reset lines may be configured so as to share an interconnect structure, allowing a single finger region (or other interconnect or contact structure) to be used to operate both an enable line and a reset line. Turning to FIG. 6, an example of one such implementation is provided. In this example, scan modules 150 are shown which are configured to connect to respective "scan lines", each of which is connected to a respective row of pixels 138. While in a conventional, passive pixel arrangement each interconnection to a single scan line by the scan modules 150 would both cause readout selection and reset of the same respective pixel row, in the present interconnect arrangement, the presence of separate readout selection and reset lines is provided for. In particular, a staggered interconnect arrangement is shown in which readout (i.e., row selection on or off) is performed on a current row, i, of pixels 138 concurrently with the reset of the preceding row, i−1, which was presumably enabled and read in the previous clock cycle or operation set. That is, the controlling terminal of the readout select gate of one line of pixels is connected to the controlling terminal of the reset gate of another line of pixels.

In this example, each scan module 150 has a set of output lines 152 (i.e., Output 0 through Output n). Conventionally, each output line 152 would correspond to a single scan line. In the present example, however, each interconnect structure connects, via a single output line 152, to a pair of staggered control lines, such that a single interconnect structure activates an enable line 142 for a current pixel row i and a reset line 140 for the preceding pixel row i−1. In this manner, the number of interconnect structures may correspond to a context where a single scan line connects to each row of pixels, while actually allowing for the operation of multiple scan lines (e.g., separate enable lines 142 and reset lines 140) for each pixel row. Thus, upon sequential activation of a given scan module output 152, a current row of pixels is enabled for readout and the previously readout row of pixels is reset. Note that the number of the total scan module outputs is equal to the number of row of the pixel array plus one. This is because there is no reset associated to the readout selection of the first row and the last signal line of the scan module output is for the reset of the last row of the pixel array only.

Figure 7:
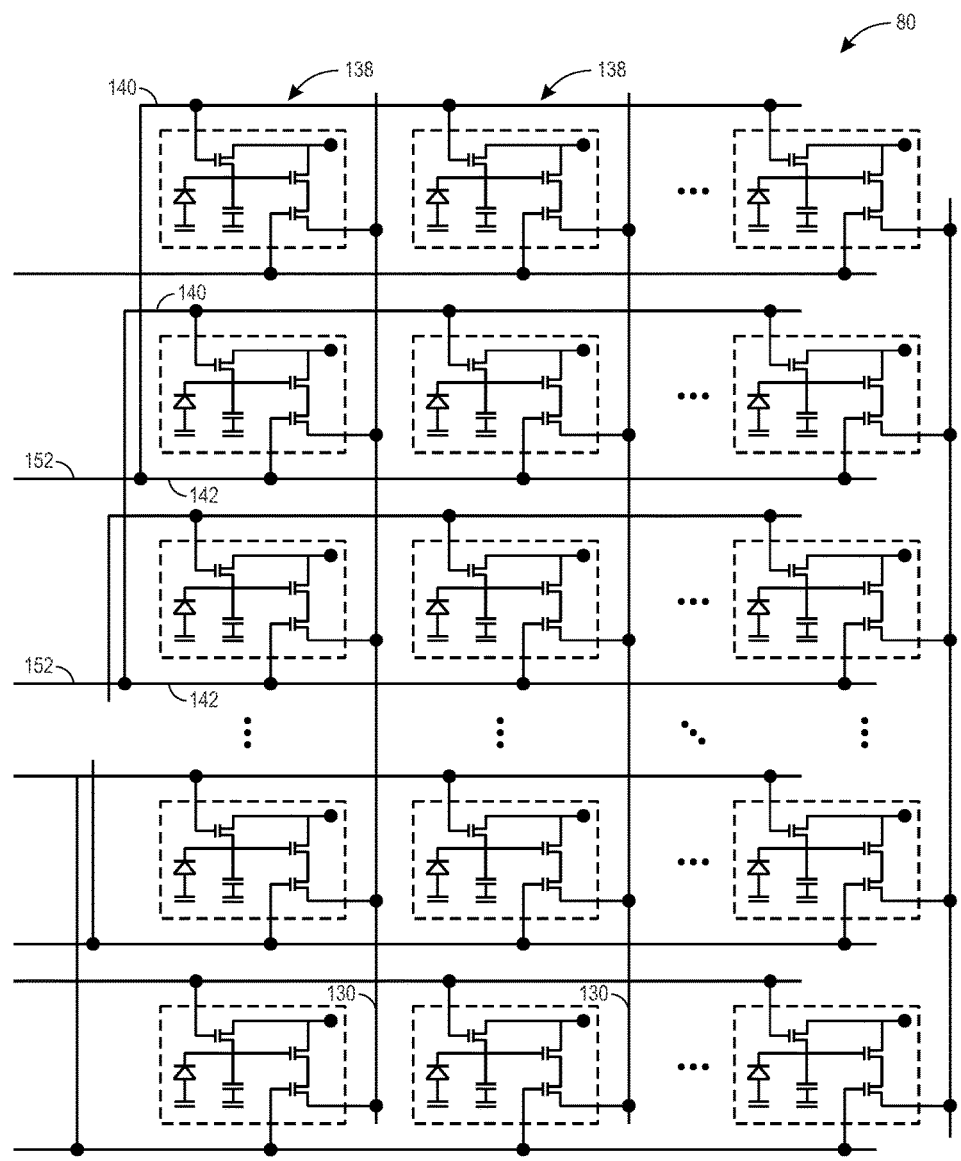
FIG. 7 depicts a circuit view of an active pixel array configured to be read and reset as shown in FIG. 6, in accordance with aspects of the present disclosure.

Turning to FIG. 7, a circuit-type view of this approach is further provided. In this figure, the bifurcation of the output line 152 and the respective connections between reset lines 140 and enable lines 142 and respective rows of pixels 138 are further illustrated.

Figure 8:
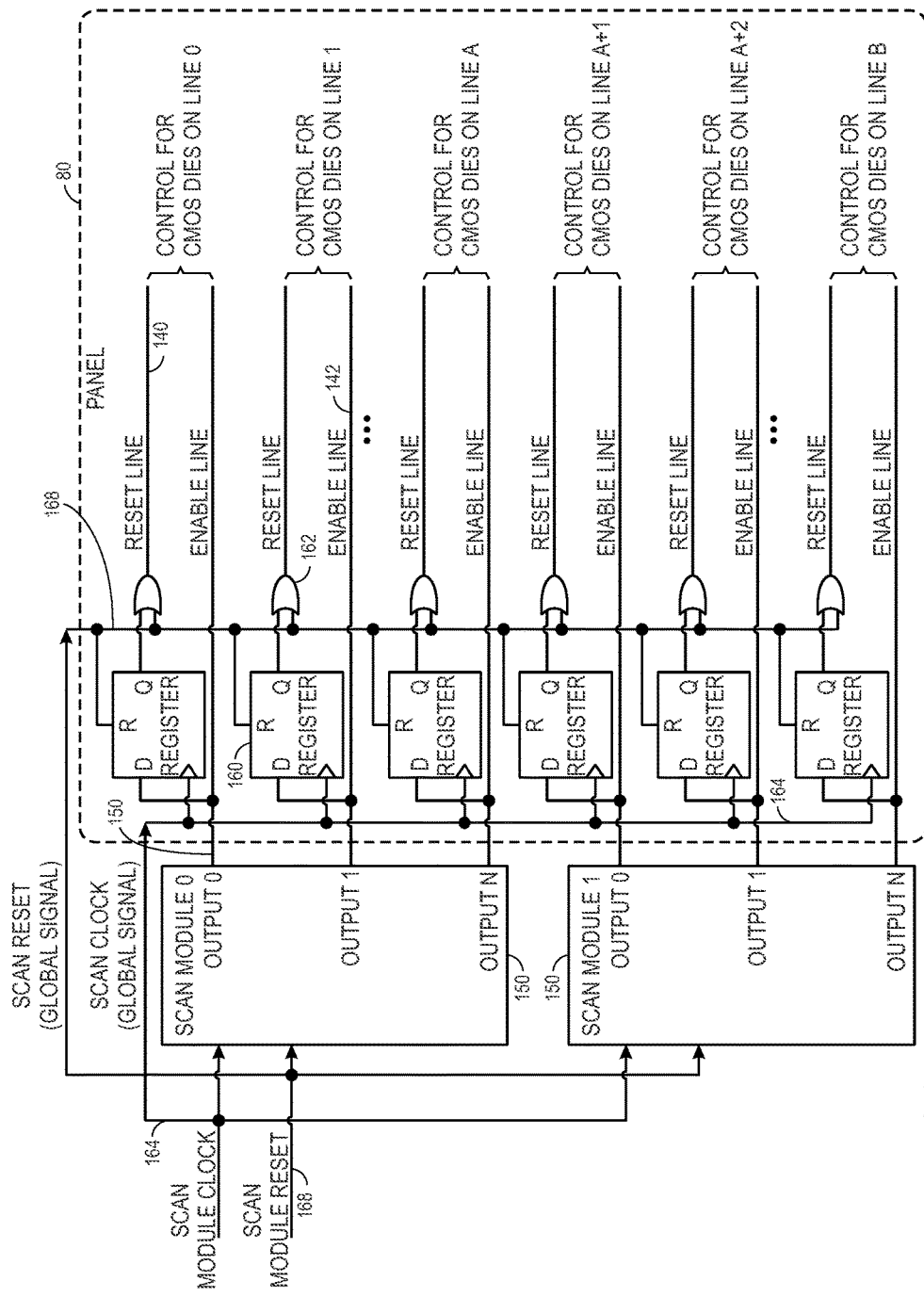
FIG. 8 depicts an alternative schematic of scan module outputs configured to read a current line of pixels while resetting a preceding line of pixels, in accordance with aspects of the present disclosure.

Turning to FIG. 8, an alternative approach is illustrated that allows for independent readout and reset of the respective pixel rows. As in the preceding implementation, each output line 150 allows for the readout of a current line of pixels 138 and the reset of a preceding line of pixels 138 except the first row. However, in addition, additional logic may be provided on each panel 80, such as in the form of registers 160 and Or gates 162, which provide additional flexibility in the operation of the panel 80. In the depicted example, a global "scan clock" signal 164 provided to the scan modules 150 may be propagated to the registers 160 where logic programmed via the registers 160 and gates 162 may use the signal 164 to flexibly control or order the readout select operations performed on rows of pixels 138 via enable lines 142. Similarly, a global "scan reset" signal 168 provided to the scan modules 150 may be propagated to the registers 160 where logic programmed via the registers 160 and gates 162 may use the signal 168 to flexibly control or order the reset operations, including global reset operations, performed on rows of pixels 138 via reset lines 140. Incorporation of additional logic on the light imager panel 80 in this manner provides for additional flexibility in terms scan direction and readout operations as well as reset of pixel rows.

Figure 9:
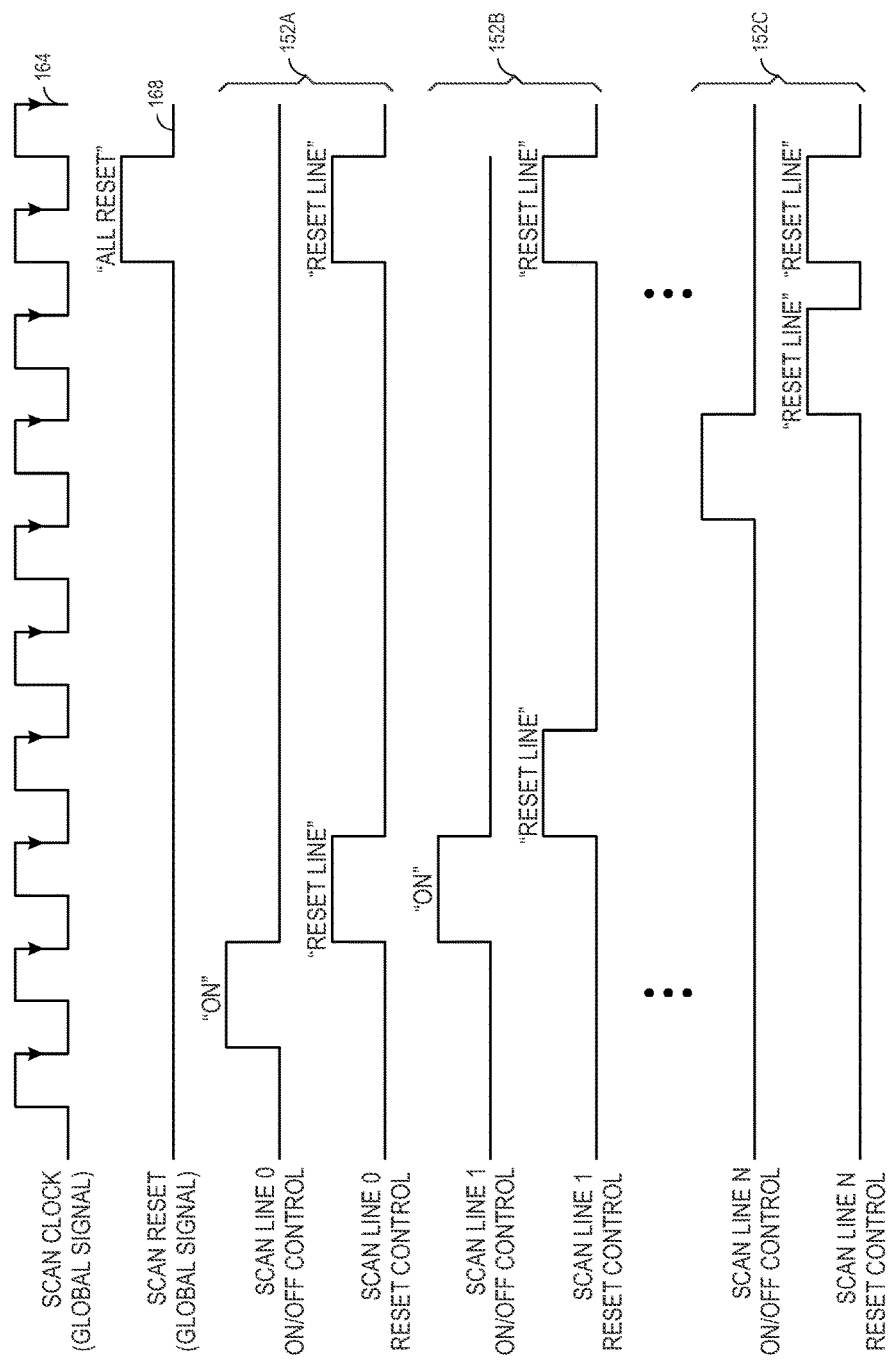
FIG. 9 depicts a timing diagram of waveforms associated with the operation of the schematic of FIG. 8, in accordance with aspects of the present disclosure.

Turning to FIG. 9, an example of a timing diagram (i.e., a waveform diagram) is provided illustrating electrical activity on various control lines of the implementation shown in FIG. 8. In this scenario, activity on Output 0 (152A), Output 1 (152B) and Output n (152C) is depicted in the form of respective timing waveforms corresponding to the respective enable lines 142 and reset lines 140 associated with those respective Output lines. Likewise, a global "scan clock" signal 164 and a global "scan reset" signal 168 provided to the scan modules 150 is depicted, with each period of the "scan clock" signal corresponding to turning on the next enable line and turning off the preceding line. As discussed above, turning on a "current" row of pixels 138 is programmed or hardwired to cause the reset of the preceding row of pixels 138. In addition, propagation of a global reset signal may cause each row of pixels to be simultaneously reset, such as at the end or beginning of a patient imaging examination.

As will be appreciated, the preceding examples illustrate the electrical interconnections and signals that may be employed to allow a single interconnect structure to drive separate enable and reset lines, thus addressing certain issues related to spacing and layout of interconnect structures in an active pixel context. As may be appreciated, the physical or structural layout of particular detector configurations may also pose certain challenges.

By way of example, in certain situations detectors 22 may be fabricated to accommodate various spatial or shape requirements of a particular imaging application. For example, in some embodiments a non-square or non-rectangle detector may be used for imaging. With respect to various of the imaging geometries discussed herein, the following concepts may be useful for forming the physical interconnections used to communicate with the detector. As used herein with respect to a detector 22, the term square may refer to a shape with four sides of equal length that also has four 90 degree corners. The term circle, in some embodiments, may refer to a closed plane curve having all points at a given distance from a common center point. The term squircle, in some embodiments, may refer to a Boolean intersection of a concentric circle and square, where the final shape has an area less than either the circle or the square. The term squircle, in other embodiments, may refer to a Boolean intersection of a square and a concentric circle whose diameter is greater than the length of the side of the square, but less than the diagonal of the square. The term mathematical squircle, in some embodiments, may refer to a specific type of superellipse with a shape between those of a concentric square and circle and may be expressed as a quadric planar curve or as a quadric Cartesian equation. A mathematical squircle, as opposed to the squircle shapes immediately above, maintains the tangent continuity between the circular corners with the flatter edges of a superellipse. The terms rounded square and rounded rectangle, in some embodiments, may respectively refer to a square or a rectangle with fillets breaking the corners (e.g., circular corners that are tangent to the edges of the square or rectangle). Additionally, in some embodiments the terms chamfered square and chamfered rectangle may respectively refer to a square and rectangle having any number of chamfers breaking their corners.

Figure 10:
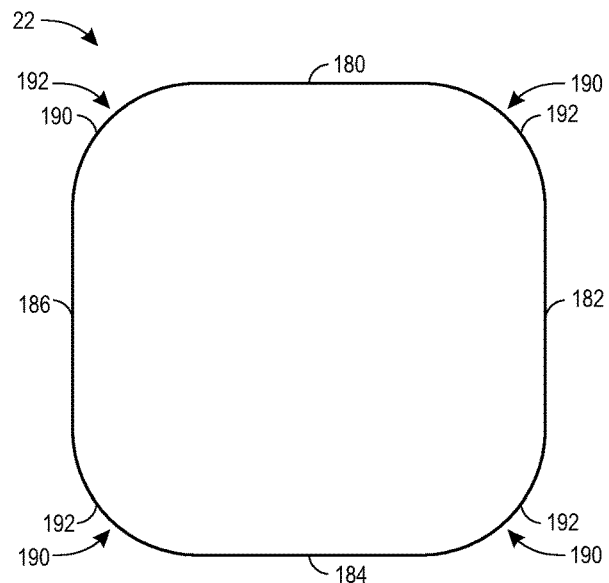
FIG. 10 depicts an example of a squircle-shaped flat panel detector, in accordance with aspects of the present disclosure.

FIG. 10 shows example of a non-square shaped flat-panel detector 22. In some configurations, the shape of the detector 22 can be a superellipse shape or a cornerless shape. A cornerless shape comprises a shape missing one or more ninety-degree corners (i.e., two edges that run substantially perpendicular to each other without containing a ninety-degree corner between those edges). The cornerless shape may contain corners with a degree less than ninety-degrees. Some examples of such shapes include a rounded square, a rounded rectangle, a chamfered square, a chamfered rectangular, a rectangle with curved borders, a truncated circle, an octagon, a hexagon, or any other suitable shape.

Where the detector has the shape of a superellipse, it can have any suitable characteristic that allows it to be classified as a superellipse. By way of example, the aperture can be a shape that is generated by a formula selected from: (i) $|x-a|^n+|y-b|^n=|r|^n$, or $$\left|\frac{(x-a)}{r_a}\right|^n + \left|\frac{(y-b)}{r_b}\right|^n = 1 \quad \text{(ii)}$$

wherein a, b is the center point; r is the minor; n is equal to 4; and $r_a$ and $r_b$ are the semi-major and semi-minor axes, respectively.

FIG. 10 depicts an example of a detector 22 shaped as a superellipse. In FIG. 10, the detector 22 contains a first 180 and second 182 images edge, a second 182 and third 184 edge, a third 184 and fourth 186 edge, and a fourth 186 and first 180 edge, respectively, which do not physically intersect at a ninety-degree corner. Rather, the detector corners 190 are removed so the detector's first edge 180 and third edge 154 are each separated from the second edge 182 and fourth edge 54 by a non-linear (i.e., substantially curved) image border, e.g., arc-shaped borders 192.

Figure 11:
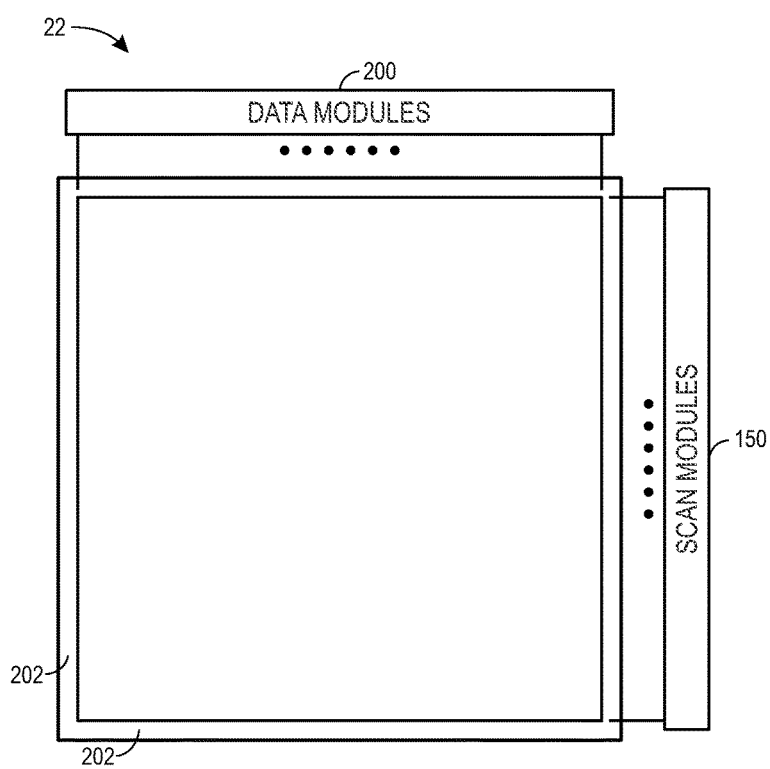
FIG. 11 depicts a prior art scan and data module arrangement for a square detector.
Figure 12:
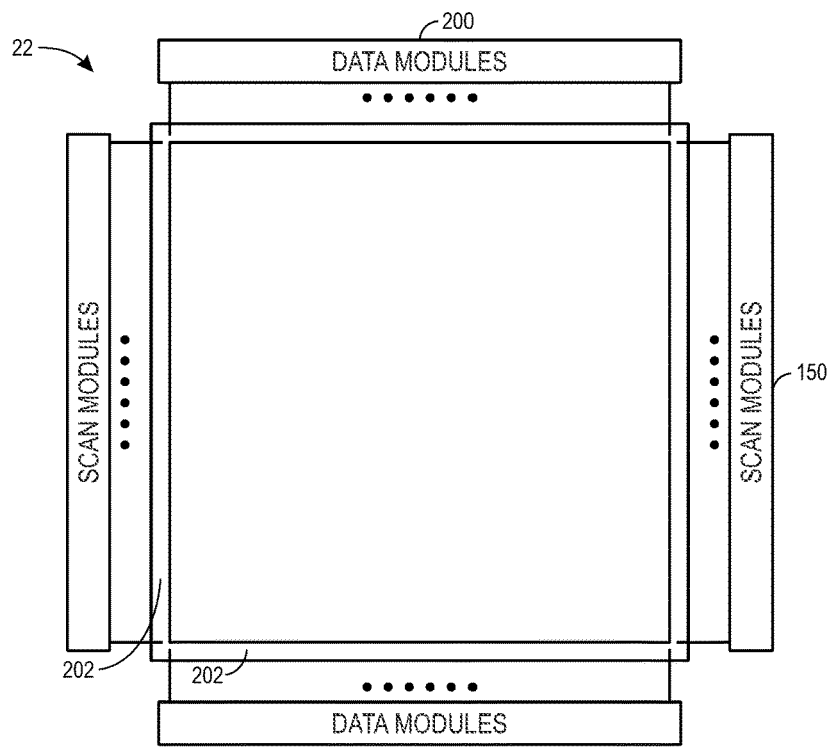
FIG. 12 depicts a prior art alternative scan and data module arrangement for a square detector.

The non-rectangular (e.g., non-square) detector configurations may pose certain interconnection issues in terms of connection placement and overlap. For example, a square detector can provide for non-overlapping data and scan line interconnects along separate sides of the detector 22, as shown in FIGS. 11 and 12 where data modules 200 and scan modules 150 have access to, and interconnect at, separate contacting finger regions 202 running on different side of the detector 22 without any of the finger regions needing to be shared or otherwise overlapping. The contacting finger areas 202 of the light imager 84 of the detectors 22 are connected to a flex connector. The contacting finger areas 202 can include the column A/D convertors, the scanning driving circuitry, and the contacting pads, that are connected to the detector controlling electronics using the flex connector.

Figure 13:
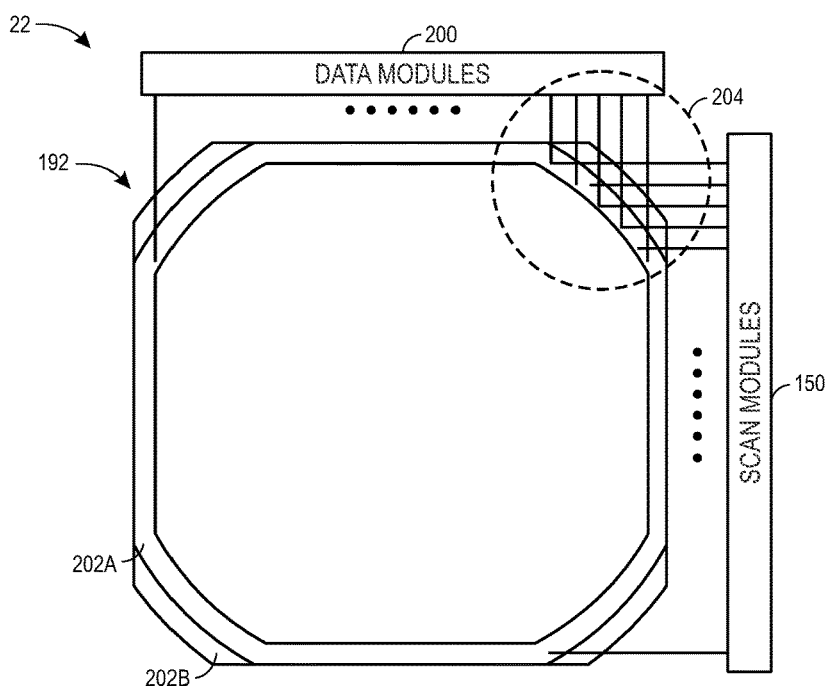
FIG. 13 depicts a squircle-shaped detector in the context of a conventional scan and detector module arrangement.

However, in the case of the non-rectangular or non-square detector 22 introduced in FIG. 10, and shown in an interconnection context in FIG. 13, the contact finger areas 202 associated with the horizontal and vertical edges overlap (shown by way of example in circle 204) at the arc-shaped borders 192. As a result, forming the interconnect structures at the finger areas 202 for both data and scan lines may be spatially constrained in such a non-rectangular configuration. One approach to this issue may be to lay the scan and data flex circuits over one another (e.g., bonding the scan line flex circuit on a smaller radius contact region 202A than the data line flex circuit, which may be interconnected at 202B) route the respective contact fingers accordingly. However such an approach may lead to undesired manufacturing complexity.

Figure 14:
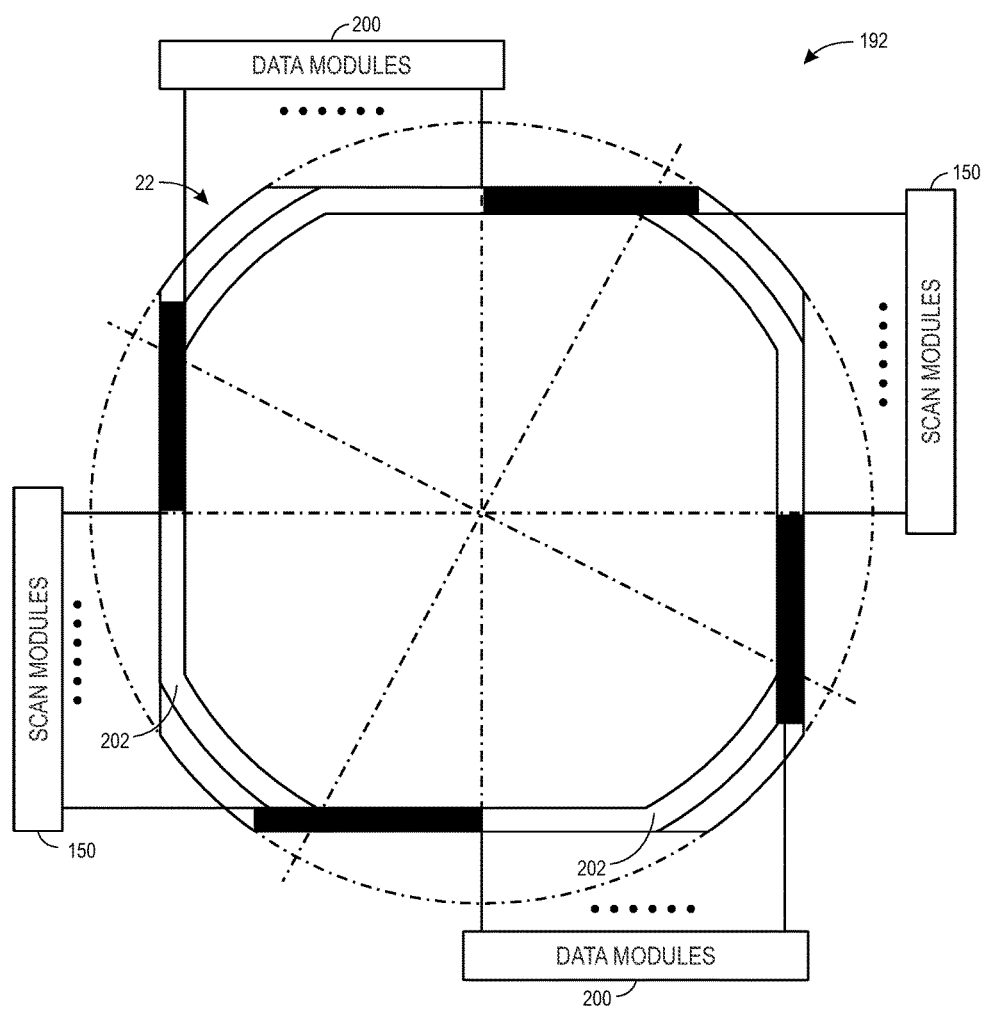
FIG. 14 depicts a squircle-shaped detector in the context of a quadrant-based, alternating scan and detector module arrangement, in accordance with aspects of the present disclosure.
Figure 15:
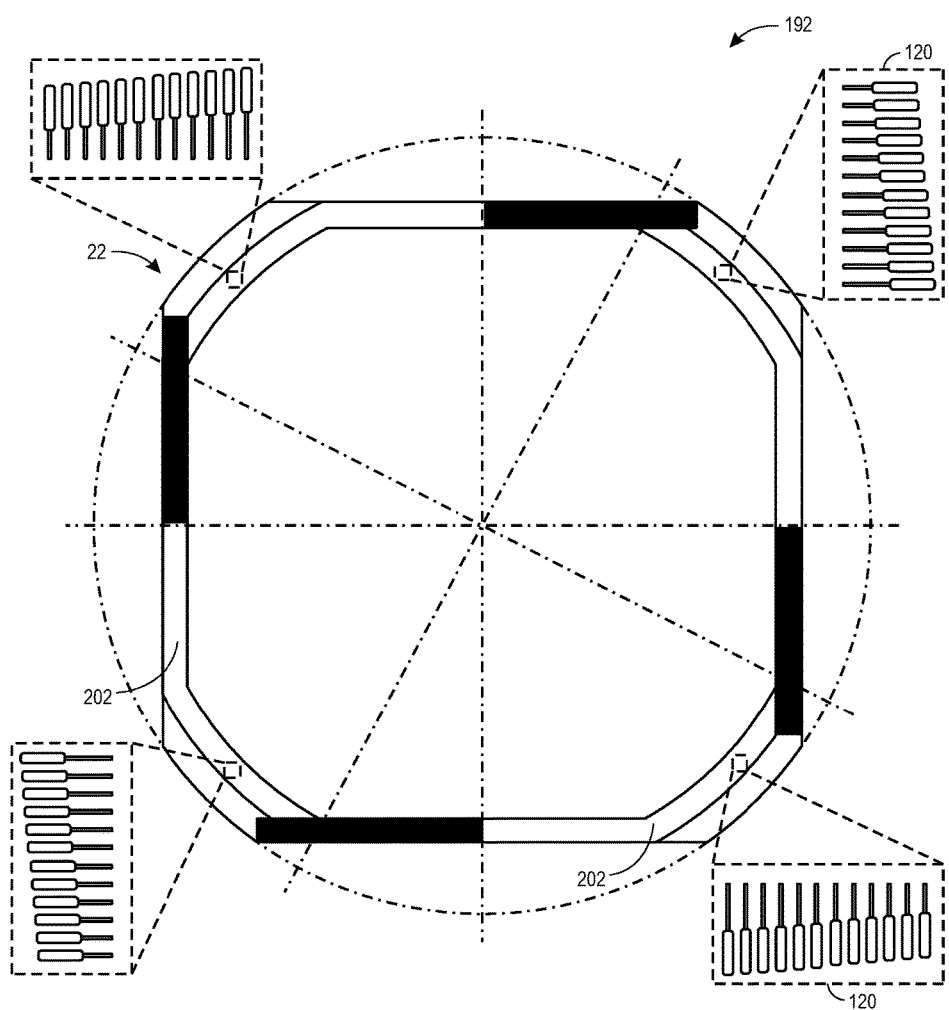
FIG. 15 depicts contact finger arrangements and configurations for the squircle-shaped detector of FIG. 14, in accordance with aspects of the present disclosure.

Turning to FIG. 14, in one implementation these issues may be resolved by interconnecting the detector 22 based on alternating quadrants of scanning circuitry (or connective traces for connection to scanning circuitry (e.g, scan modules)) and readout circuitry (or connective traces for connection to readout circuitry (e.g., data modules)). In the depicted implementation, the data module 200 (i.e., readout circuitry) and scan module 150 circuitry is provided off panel (i.e., is not formed on the silicon wafer used to fabricate the light imager panel). Each quadrant of the detector is interconnected to only either a data module 200 (i.e., a readout quadrant, here depicted connected to a left-hand data module on top and a right-hand data module on bottom) or a scan module 150 (i.e., a scanning quadrant, here depicted connected to atop-half scan module on the right and a bottom-half scan module on the left), thus preventing issues related to interconnect overlap as discussed with respect to FIG. 13. Turning to FIG. 15, the contact fingers 220 of the finger regions 202 are shown enlarged for each quadrant to better illustrate the approach.

Figure 16:
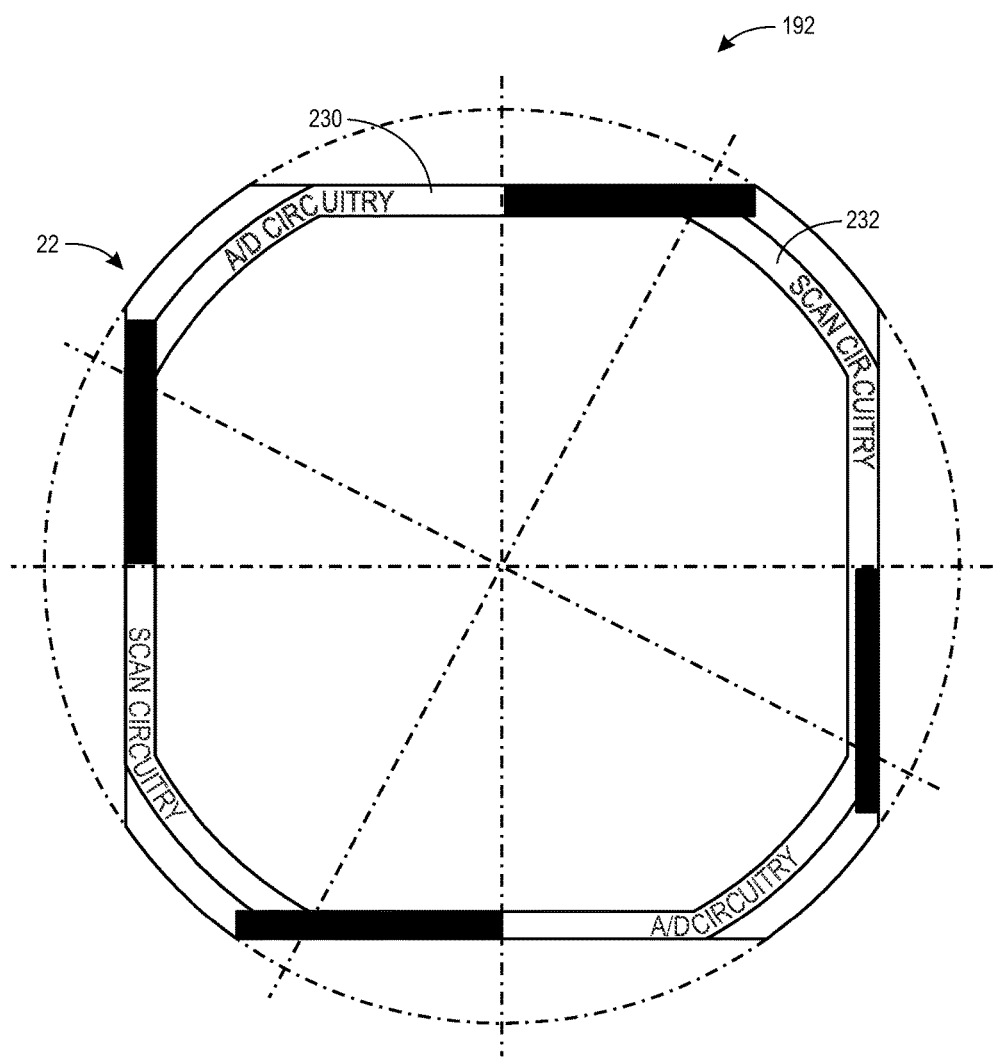
FIG. 16 depicts a squircle-shaped detector in the context of a quadrant-based, alternating arrangement of on-panel scan and data readout circuitry, in accordance with aspects of the present disclosure.

Turning to FIG. 16, an alternative implementation is shown in which, instead of off-panel scan and data modules, the functionality of such modules is fabricated on the light imager panel (i.e., on the wafer). In particular, A/D circuitry 230 corresponding to the functionality of the data modules 200 and scan circuitry 232 corresponding to the functionality of the scan modules 150 is shown formed on the light imager panel of the detector 22. In the depicted example, the A/D circuitry 230 and scan circuitry 232 is formed in the same alternating quadrant fashion, as discussed above with respect to FIGS. 14-15, to address overlap and spatial constraints imposed by the non-rectangular detector configuration.

Figure 17:
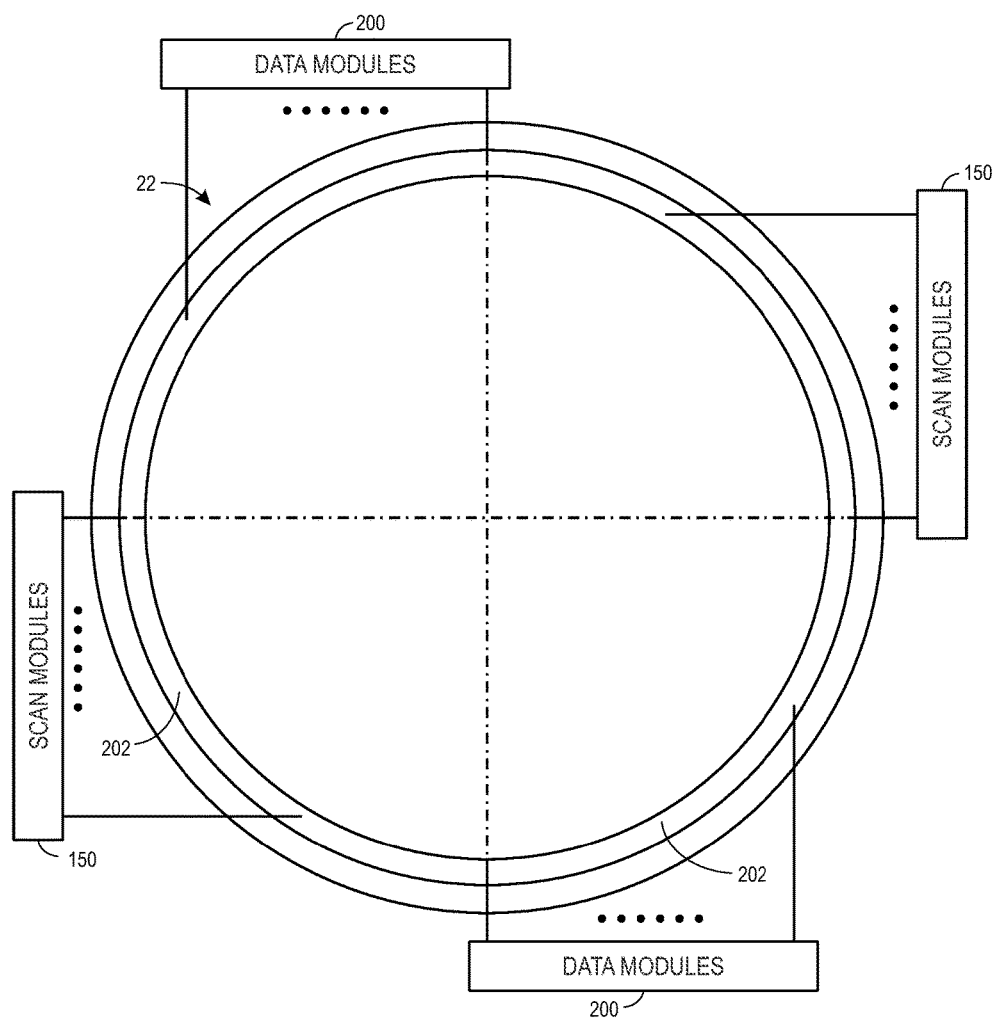
FIG. 17 depicts a circle-shaped detector in the context of a quadrant-based, alternating scan and detector module arrangement, in accordance with aspects of the present disclosure.
Figure 18:
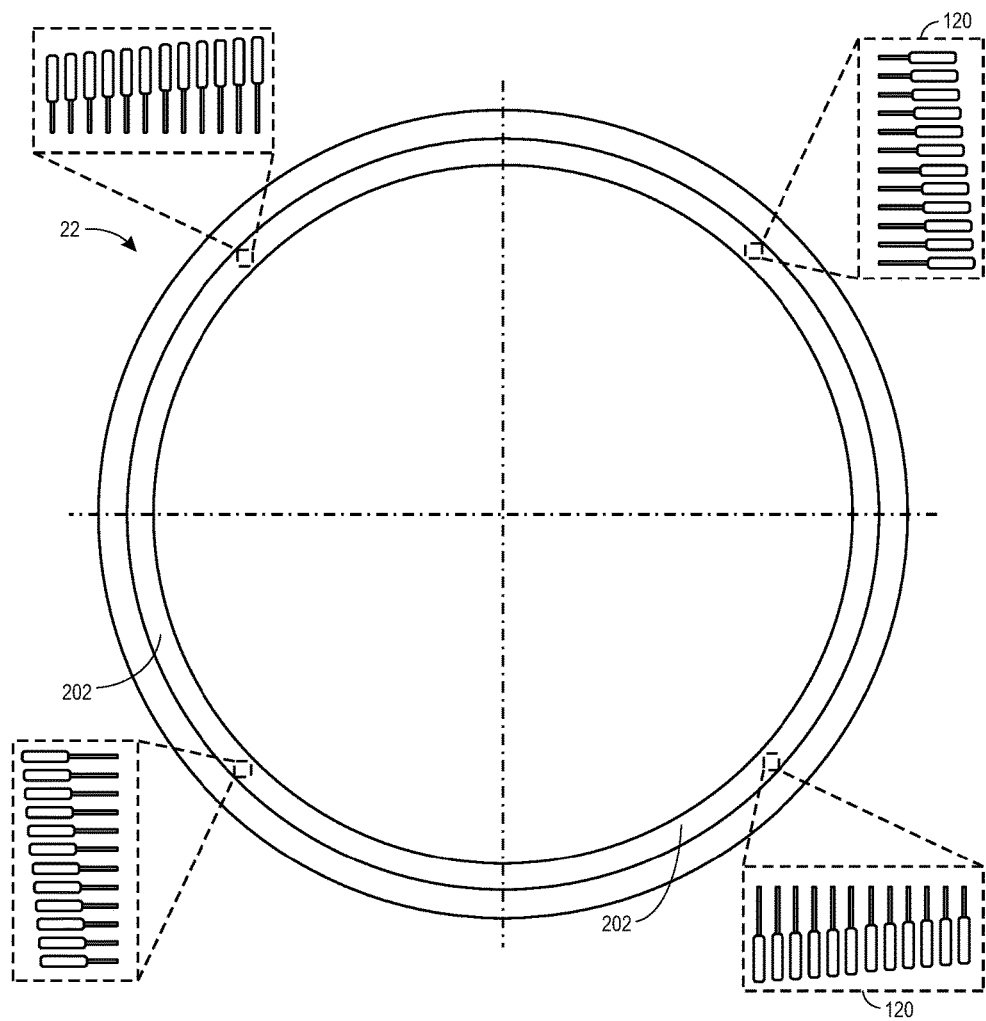
FIG. 18 depicts contact finger arrangements and configurations for the circle-shaped detector of FIG. 17, in accordance with aspects of the present disclosure.

While FIGS. 14-16 relate one example of a non-rectangular detector configuration, the present approach is also applicable to other detector configurations, including circular detector configurations. By way of example, turning to FIG. 17, in a circular detector configuration the spatial constraint and interconnection issues may also be resolved by interconnecting the detector 22 based on alternating quadrants. In the depicted implementation, the data module 200 and scan module 150 circuitry is provided off panel (i.e., is not formed on the silicon wafer used to fabricate the light imager panel). Each quadrant of the detector is interconnected to only either a data module 200 (i.e., a readout quadrant, here depicted connected to a left-hand data module on top and a right-hand data module on bottom) or a scan module 150 (i.e., a scanning quadrant, here depicted connected to a top-half scan module on the right and a bottom-half scan module on the left), thus preventing issues related to interconnect overlap as discussed with respect to FIG. 13. Turning to FIG. 18, the contact fingers 220 of the finger regions 202 are shown enlarged for each quadrant to better illustrate the approach.

Figure 19:
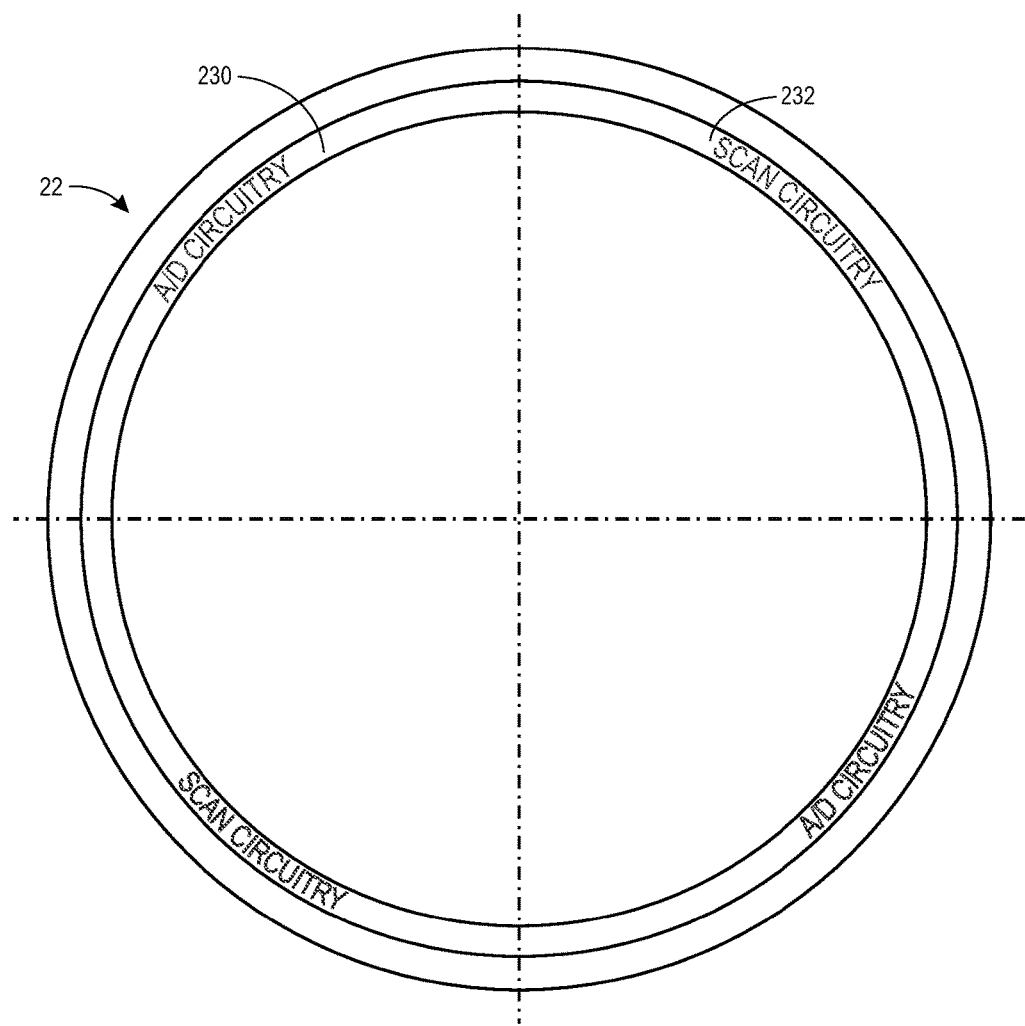
FIG. 19 depicts a circle-shaped detector in the context of a quadrant-based, alternating arrangement of on-panel scan and data readout circuitry, in accordance with aspects of the present disclosure.

Turning to FIG. 19, an alternative implementation is shown in which, instead of off-panel scan and data modules, the functionality of such modules is fabricated on the circular light imager panel (i.e., on the wafer). In particular, A/D circuitry 230 corresponding to the functionality of the data modules 200 and scan circuitry 232 corresponding to the functionality of the scan modules 150 is shown formed on the light imager panel of the detector 22. In the depicted example, the A/D circuitry 230 and scan circuitry 232 is formed in the same alternating quadrant fashion, as discussed above with respect to FIGS. 17-18, to address overlap and spatial constraints imposed by the circular detector configuration.

Technical effects of the invention include providing a scan interface for a detector having separate enable and reset lines for each line (e.g., row) of pixels and interconnecting the respective enable and reset lines such that activation of an enable line for a given line of pixels is concurrent with activation of a reset line for a different (e.g., preceding) row of pixels. In this manner, readout of one row of pixels is performed in conjunction with resetting the tow of pixels readout in the preceding operation. In another technical implementation, a non-rectangular (e.g., a squircle or circle) detector is divided into quadrants, with alternating quadrants configured for scan module or data module operations such that no quadrant has overlapping scan and data interconnections at the connection finger regions. By designing the contacting trace of the data lines and the scan lines according to the even and odd quadrants, the surface area usage of the silicon wafer can be maximized so as to reduce the detector cost. The disclosed technology can be applied to X-ray detector having either a squircle shape or a circular shape.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A flat panel X-ray detector comprising:
a scintillator layer that converts X-ray photons into lower energy light photons;
a light imager layer configured to convert the light photons into electrons, wherein the light imager layer comprises an array of active pixels, each active pixel comprising a reset gate and a readout select gate, wherein a first controlling terminal of a respective readout select gate of at least one active pixel is connected to a second controlling terminal of the reset gate of a different active pixel;
a readout device that converts the electrons into digitized pixel values; and
a communication unit that transfers the pixel values to an imaging system that is connected to the detector,
wherein the array of active pixels is arranged in rows such that starting in the second row, the respective readout select gates of a $n^{th}$ row of active pixel are connected to the respective reset gates of a $(n-1)^{th}$ row of active pixels such that activation of the readout select gates of the $n^{th}$ row of active pixel coincides with activation of the reset gates of the $(n-1)^{th}$ row of active pixels.

2. A flat panel X-ray detector comprising:
a scintillator layer that converts X-ray photons into lower energy light photons;

a light imager layer configured to convert the light photons into electrons, wherein the light imager layer comprises an array of active pixels, each active pixel comprising a reset gate and a readout select gate, wherein a first controlling terminal of a respective readout select gate of at least one active pixel is connected to a second controlling terminal of the reset gate of a different active pixel;

a readout device that converts the electrons into digitized pixel values; and a communication unit that transfers the pixel values to an imaging system that is connected to the detector, wherein the array of active pixels is arranged in columns and rows wherein each row of pixels is interconnected to both a reset line connected to the respective reset gates of active pixels in the row and an enable line connected to respective readout select gates of active pixels in the row.

3. The flat panel X-ray detector of claim 2, wherein the reset lines are configured, when activated, to reset the charge state of photodiodes of the connected active pixels.

4. The flat panel X-ray detector of claim 2, wherein the enable lines are configured, when activated, to set an on/off state of the connected active pixels.

5. The flat panel X-ray detector of claim 2, wherein the array of active pixels is arranged in columns and rows wherein each column of pixels is interconnected a respective data line.

6. A flat panel X-ray detector comprising:

a scintillator layer that converts X-ray photons into lower energy light photons;

a light imager layer configured to convert the light photons into electrons, wherein the light imager layer comprises an array of active pixels, each active pixel comprising a reset gate and a readout select gate, wherein a first controlling terminal of a respective readout select gate of at least one active pixel is connected to a second controlling terminal of the reset gate of a different active pixel;

a readout device that converts the electrons into digitized pixel values; and a communication unit that transfers the pixel values to an imaging system that is connected to the detector, wherein during operation the readout select gates are operated more often than the reset gates.

7. A method for reading out a flat panel detector comprising:

sequentially activating outputs of scan circuitry, wherein each output of the scan circuitry, when activated, causes a current respective row of pixels to be selected for readout and concurrently causes a preceding row of pixels to be reset; and acquiring pixel values as each respective row of pixels is selected for readout.

8. The method of claim 7, wherein the scan circuitry is not fabricated on a light imager panel on which the pixels are formed.

9. The method of claim 7, wherein the scan circuitry is fabricated on a light imager panel on which the pixels are formed.

10. The method of claim 7, wherein the scan circuitry is configured as a set of scan modules that receive as inputs separate scan module clock signals and scan module reset signals in response to which the outputs of the scan circuitry are sequentially activated.

11. The method of claim 7, wherein the number of outputs is equal to the number of rows of pixels plus one.

12. A flat panel X-ray detector comprising:

a scintillator layer that converts X-ray photons into lower energy light photons;

a light imager layer configured to convert the light photons into electrons, wherein the light imager layer is partitioned into two scanning quadrants comprising scanning circuitry or contacting traces connecting to scanning circuitry, and two readout quadrants comprising readout circuitry or contacting traces connecting to readout circuitry, wherein the scanning quadrants and readout quadrants are alternated with one another;

a readout device that converts the electrons into digitized pixel values; and a communication unit that transfers the pixel values to an imaging system that is connected to the detector.

13. The flat panel X-ray detector of claim 12, wherein the flat panel X-ray detector is formed as a non-rectangular detector.

14. The flat panel X-ray detector of 12, wherein the flat panel X-ray detector is formed as a circular or squircle-shaped detector.

15. The flat panel X-ray detector of claim 12, wherein each quadrant of the flat panel X-ray detector is connected to only one of scanning circuitry or readout circuitry.

16. A method for forming connections on or to a radiation detector, comprising:

in a first quadrant of a light image panel of the radiation detector, forming only scan line interconnections in a first direction;

in a second quadrant of the light imager panel, forming only data line interconnections in a second direction different from the first direction;

in a third quadrant of the light imager panel, forming only scan line interconnections in the first direction; and in a fourth quadrant of the light imager panel, forming only data line interconnections in the second direction;

wherein, within a plane defined by the radiation detector, the second quadrant is between the first quadrant and the third quadrant and the fourth quadrant is between the third quadrant and the first quadrant and opposite the second quadrant.

17. The method of claim 16, wherein the scan line interconnections and data line interconnections are formed with scan modules and date modules, respectively, provided off of the light imager panel.

18. The method of claim 16, wherein the scan line interconnections and data line interconnections are formed with scan circuitry and date circuitry, respectively, provided on the light imager panel.

19. The method of claim 16, wherein the radiation detector comprises one or more arcuate borders.

* * * * *